United States Patent
Hosseinimakarem et al.

(10) Patent No.: US 11,961,829 B2
(45) Date of Patent: *Apr. 16, 2024

(54) STACKED LIGHT EMITTING DIODE (LED) HOLOGRAM DISPLAY

(71) Applicant: Micron Technology, Inc., Boise, ID (US)

(72) Inventors: Zahra Hosseinimakarem, Boise, ID (US); Ariela E. Gruszka, Boise, ID (US); Mandy W. Fortunati, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/967,374

(22) Filed: Oct. 17, 2022

(65) Prior Publication Data
US 2023/0035577 A1 Feb. 2, 2023

Related U.S. Application Data

(63) Continuation of application No. 17/102,760, filed on Nov. 24, 2020, now Pat. No. 11,476,235.

(51) Int. Cl.
| | | |
|---|---|---|
| *H01L 25/075* | (2006.01) | |
| *G02F 1/13357* | (2006.01) | |
| *H01L 33/62* | (2010.01) | |

(52) U.S. Cl.
CPC .......... *H01L 25/0753* (2013.01); *H01L 33/62* (2013.01); *G02F 1/133603* (2013.01)

(58) Field of Classification Search
CPC ................ H01L 25/0753; H01L 33/62; G02F 1/133603
See application file for complete search history.

(56) References Cited

U.S. PATENT DOCUMENTS

| | | |
|---|---|---|
| 10,802,199 B2 | 10/2020 | Choi et al. |
| 2004/0012831 A1 | 1/2004 | Kim et al. |

(Continued)

FOREIGN PATENT DOCUMENTS

KR   10-2018-0053030   5/2018

OTHER PUBLICATIONS

International Search Report and Written Opinion from related international application No. PCT/US2021/060289, dated Mar. 7, 2022, 9 pages.

*Primary Examiner* — Mary Ellen Bowman
(74) *Attorney, Agent, or Firm* — Brooks, Cameron & Huebsch, PLLC

(57) ABSTRACT

Embodiments of the present disclosure include apparatuses and method for a stacked light emitting diode (LED) hologram display. A stacked LED hologram display can include a first array of LEDs that are configured to emit red light received by a meta-optics panel configured to display a first portion of a holographic image, a second array of LEDs that are configured to emit green light received by a meta-optics panel configured to display a second portion of a holographic image, and a third array of LEDs that are configured to emit blue light received by a meta-optics panel configured to display a third portion of a holographic image. The stacked LED hologram display can include a number of actuators configured to adjust a position of a first array of LEDs in first direction and a second direction, adjust a position of a second array of LEDs in the first direction and the second direction, and adjust a position of a third array of LEDs in the first direction and the second direction.

20 Claims, 6 Drawing Sheets

(56) References Cited

U.S. PATENT DOCUMENTS

| | | |
|---|---|---|
| 2004/0061827 A1* | 4/2004 | Park .................... G02F 1/13342 |
| | | 349/201 |
| 2016/0055801 A1 | 2/2016 | Kim et al. |
| 2018/0017801 A1 | 1/2018 | Chang et al. |
| 2019/0237446 A1 | 8/2019 | Bang |
| 2019/0334060 A1 | 10/2019 | Zou et al. |
| 2020/0027865 A1 | 1/2020 | Fan et al. |
| 2020/0083412 A1 | 3/2020 | Ahn et al. |
| 2020/0235127 A1 | 7/2020 | Li et al. |
| 2020/0271932 A1 | 8/2020 | Tuomisto et al. |
| 2020/0350360 A1 | 11/2020 | Ahmed et al. |

* cited by examiner

ADJUSTING A POSITION OF A FIRST ARRAY OF LIGHT EMITTING DIODES (LEDs) IN A FIRST DIRECTION AND A SECOND DIRECTION ORTHOGONAL TO THE FIRST DIRECTION, THE ADJUSTING RELATIVE TO AN ORIGIN POINT OF THE FIRST ARRAY, WHEREIN THE FIRST ARRAY OF LEDs ARE CONFIGURED TO EMIT RED LIGHT IN A RED GREEN BLUE (RGB) DISPLAY —650

DISPLAYING A FIRST PORTION OF A HOLOGRAPHIC IMAGE BY A FIRST META-OPTICS PANEL FROM LIGHT EMITTED BY THE FIRST ARRAY —652

ADJUSTING A POSITION OF A SECOND ARRAY OF LEDs IN THE FIRST DIRECTION AND THE SECOND DIRECTION RELATIVE TO AN ORIGIN POINT OF THE SECOND ARRAY, WHEREIN THE SECOND ARRY OF LEDs ARE CONFIGURED TO EMIT GREEN LIGHT IN THE RGB DISPLAY —654

DISPLAYING A SECOND PORTION OF THE HOLOGRAPHIC IMAGE BY A SECOND META-OPTICS PANEL FROM LIGHT EMITTED BY THE SECOND ARRAY —656

ADJUSTING A POSITION OF A THIRD ARRAY OF LEDs IN THE FIRST DIRECTION AND THE SECOND DIRECTION RELATIVE TO AN ORIGIN POINT OF THE THIRD ARRAY, WHEREIN THE THIRD ARRY OF LEDs ARE CONFIGURED TO EMIT BLUE LIGHT IN THE RGB DISPLAY —658

DISPLAYING A THIRD PORTION OF THE HOLOGRAPHIC IMAGE BY A THIRD META-OPTICS PANEL FROM LIGHT EMITTED BY THE THIRD ARRAY —660

*FIG. 6*

STACKED LIGHT EMITTING DIODE (LED) HOLOGRAM DISPLAY

PRIORITY INFORMATION

This application is a continuation of U.S. application Ser. No. 17/102,760, filed on Nov. 24, 2020, then contents of which are incorporated herein by reference.

TECHNICAL FIELD

The present disclosure relates generally to apparatuses, non-transitory machine-readable media, and methods for a stacked light emitting diode (LED) hologram display.

BACKGROUND

Images can be viewed on display screens. Display screens can be included in a computing device. A computing device is a mechanical or electrical device that transmits or modifies energy to perform or assist in the performance of human tasks. Examples include thin clients, personal computers, printing devices, laptops, mobile devices (e.g., e-readers, tablets, smartphones, etc.), internet-of-things (IoT) enabled devices, heads-up displays, augmented reality and virtual reality devices, and gaming consoles, among others. An IoT enabled device can refer to a device embedded with electronics, software, sensors, actuators, and/or network connectivity which enable such devices to connect to a network and/or exchange data. Examples of IoT enabled devices include mobile phones, smartphones, tablets, phablets, computing devices, implantable devices, vehicles, home appliances, smart home devices, monitoring devices, wearable devices, devices enabling intelligent shopping systems, among other cyber-physical systems.

A display screen can be included in a computing device, television monitor, computer monitor and can be used to view images and/or text. The display can be a touchscreen display that serves as an input device. When a touchscreen display is touched by a finger, digital pen (e.g., stylus), or other input mechanism, associated data can be received by the computing device. The touchscreen display may include pictures and/or words, among others that a user can touch to interact with the device.

BRIEF DESCRIPTION OF THE DRAWINGS

FIG. 6 is flow diagram representing an example method for operating a stacked light emitting diode (LED) hologram display in accordance with a number of embodiments of the present disclosure.

DETAILED DESCRIPTION

Figure 1:
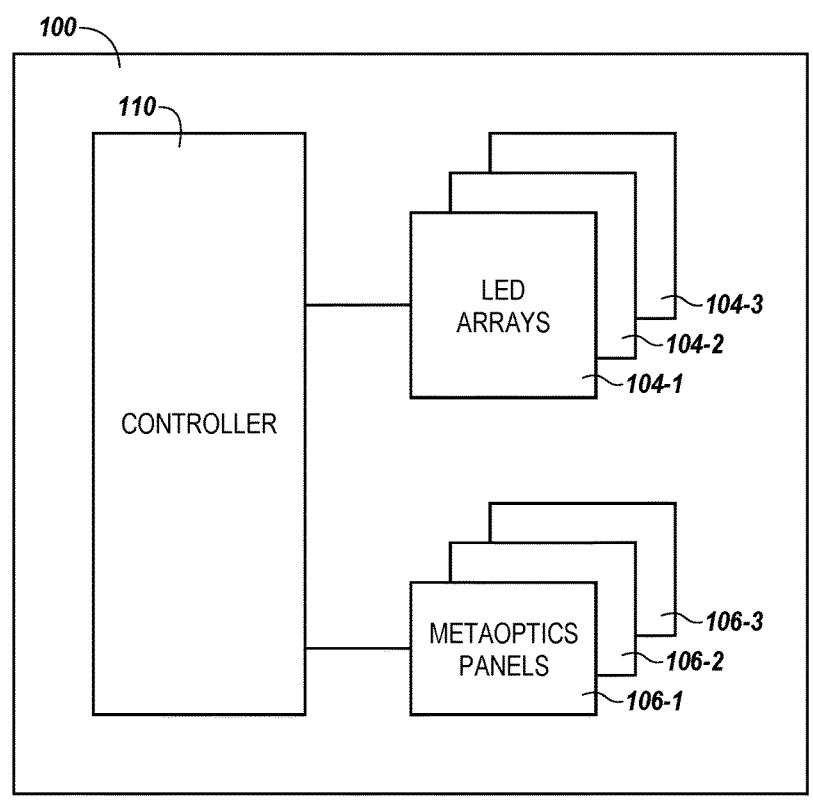
FIG. 1 is a functional block diagram a stacked light emitting diode (LED) hologram display in accordance with a number of embodiments of the present disclosure.

Embodiments of the present disclosure include apparatuses and methods for a stacked lighting emitting diode (LED) hologram display. A stacked LED hologram display can include a first array of LEDs that are configured to emit red light received by a meta-optics panel configured to display a first portion of a holographic image, a second array of LEDs that are configured to emit green light received by a meta-optics panel configured to display a second portion of a holographic image, and a third array of LEDs that are configured to emit blue light received by a meta-optics panel configured to display a third portion of a holographic image. The first, second, third arrays of LEDs can be configured to emit light on a number of meta-optics panels configured to produce (e.g., display) a holographic image (e.g., by shaping and enhancing the light emitted by the arrays). A pixel of the stacked LED display can comprise an LED from the first array, an LED from the second array, and an LED from the third array that are in a common row and column position of their respective array. For example, a pixel can be comprised of an LED in the first column and eight row of the first array, an LED in the first column and eight row of the second array, and an LED in the first column and eight row of the third array.

In a number of embodiments, the stacked LED hologram display can include a number of actuators configured to adjust a position of a first array of LEDs in a first direction (e.g., x direction) and a second direction orthogonal to the first direction (e.g., y direction), adjust a position of a second array of LEDs in the first direction and the second direction, and adjust a position of a third array of LEDs in the first direction and the second direction. The actuators can be configured to adjust the position of the arrays of LEDs in the first direction and the second direction to control a packing scheme of the pixels of the display. A packing scheme can refer to the position of the LEDs of a pixel relative to each other in the first direction and the second direction. For example, a pixel comprising a red LED, a green LED, and a blue LED can have a packing scheme where the LEDs completely overlap each other, partially overlap each other, and/or do not overlap each other. The position of the first array of LEDs in the first and second directions can allow the first array to emit light on a first meta-optics panel configured to produce a first portion of a holographic image. The position of the second array of LEDs in the first and second directions can allow the second array to emit light on a second meta-optics panel configured to produce a second portion of a holographic image. The position of the third array of LEDs in the first and second directions can allow the third array to emit light on a third meta-optics panel configured to produce a third portion of a holographic image.

In a number of embodiments, the stacked LED hologram display can include a number of actuators configured to adjust a position of each LED of a first array of LEDs in a first direction (e.g., x direction) and second direction (e.g., y direction) and an angle of rotation ($\alpha$) around the x-axis, an angle of rotation ($\beta$) around the y-axis, and an angle of rotation ($\gamma$) around the z-axis. The number of actuators can adjust a position of each LED of a second array of LEDs in the first direction and the second direction and an angle of rotation ($\alpha$) around the x-axis, an angle of rotation ($\beta$)

around the y-axis, and an angle of rotation (γ) around the z-axis. The number of actuators can adjust a position of each LED of a third array of LEDs in the first direction and the second direction and an angle of rotation (α) around the x-axis, an angle of rotation (β) around the y-axis, and an angle of rotation (γ) around the z-axis. The actuators can be configured to adjust the position of the arrays of LEDs in the first direction and second direction to control a packing scheme of the pixels of the display and/or an angle at which light emitted from the LED arrays is received by a meta-optics panel. A packing scheme can refer to the position of the LEDs of a pixel relative to each other in the first direction and second direction. For example, a pixel comprising a red LED, a green LED, and a blue LED can have a packing scheme where the LEDs completely overlap each other, partially overlap each other, and/or do not overlap each other. The position of the LEDs in the first array of LEDs in the first and second directions and angles of rotation around the x, y, and z axes can allow the first array to emit light on a meta-optics panel configured to produce a first portion (e.g., red light) of a holographic image. The position of the LEDs in the second array of LEDs in the first and second directions and angles of rotation around the x, y, and z axes can allow the second array to emit light on the meta-optics panel configured to produce a second portion (e.g., green light) of the holographic image. The position of the LEDs in the third array of LEDs in the first and second directions and angles of rotation around the x, y, and z axes can allow the third array to emit light on the meta-optics panel configured to produce a third portion (e.g., blue light) of the holographic image.

In a number of embodiments, each of the LEDs in the stack of LED arrays can be individually controlled, activated, and deactivated. The LEDs can be individually controlled, activated, and deactivated to control power consumption of the device and/or control the intensity of the light emitted from each of the LEDs.

As used herein, designators such as "N," "M," etc., particularly with respect to reference numerals in the drawings, indicate that a number of the particular feature so designation can be included. It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory devices) can refer to one or more memory devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures can be identified by the use of similar digits. For example, 104 can reference element "04" in FIG. 1, and a similar element can be referenced as 204 in FIG. 2. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram a stacked light emitting diode (LED) display 100 in accordance with a number of embodiments of the present disclosure. Display 100 includes controller 110 (e.g., a processor, control circuitry, hardware, firmware, and/or software), a first array of LEDs 104-1, a second array of LEDs 104-2, a third array of LEDs 104-3, a first meta-optics panel 106-1, a second meta-optics panel 106-2, and a third meta-optics panel 106-3. First array 104-1, second array 104-2, and third array 104-3 can be configured in a stack and can be parallel to each other. For example, array 104-3 can be on top of array 104-2 and array 104-2 can be on top of array 104-1. First meta-optics panel 106-1 can be positioned between array 104-1 and 104-2 and be configured to receive light from array 104-1, second meta-optics panel 106-2 can be positioned between array 104-2 and 104-3 and be configured to received light from array 104-2, and third meta-optics panel 106-3 can be positioned above array 104-3 and be configured to receive light from array 104-3. A number of embodiments, can include one meta-optics panel 106 that is positioned above array 104-3 and is configured to receive light from array 104-1, 104-2, and 104-3.

First array 104-1, second array 104-2, and third array 104-3 can be micro-LED arrays, where each micro-LED can be controlled and provides light for a pixel of display 100. First array 104-1 can be configured to emit red light, second array 104-2 can be configured to emit green light, and third array 104-3 can be configured to emit blue light, such that display 100 produces an image (e.g., a holographic image in a red green blue (RGB) format).

The display 100 may be a television display, a computer monitor display, and/or a touchscreen display of a mobile device, such as a smartphone, for example and be configured to display a holographic image (e.g., hologram). The controller 110 can be communicatively coupled to the LED arrays 104-1, 104-2, and 104-3 of display 100. As used herein, "communicatively coupled" can include coupled via various wired and/or wireless connections between devices such that data can be transferred in various directions between the devices. The coupling need not be a direct connection, and in some examples, can be an indirect connection. Controller 110 can include hardware, firmware, and/or software to control the LED arrays 104-1, 104-2, and 104-3 of display 100. Controller 110 can send signals to arrays 104-1, 104-2, and 104-3 to activate and/or deactivate the LEDs. LED arrays 104-1, 104-2, and 104-3 can include circuitry and electrodes such that each LED is controllable (e.g., addressable) by controller 110. Controller 110 can individually activate and/or deactivate each LED of arrays 104-1, 104-2, and 104-3.

In a number of embodiments, display 100 can received inputs from a camera, a computer, and/or an internet of things (IoT) device, among other input devices, to produce a holographic image. For example, a camera used during a medical procedure can provide an input to display 100 such that a holographic image of the portion of the body and medical instruments used during the medical procedure are displayed. Display 100 could also receive inputs to display holographic images that could provide instructions for assembling and/or fixing objects, a 3 dimensional view when arranging objects, and/or a 3-dimensional view indicating an inventory status (e.g., a refrigerator or pantry), among other inputs.

Figure 2:
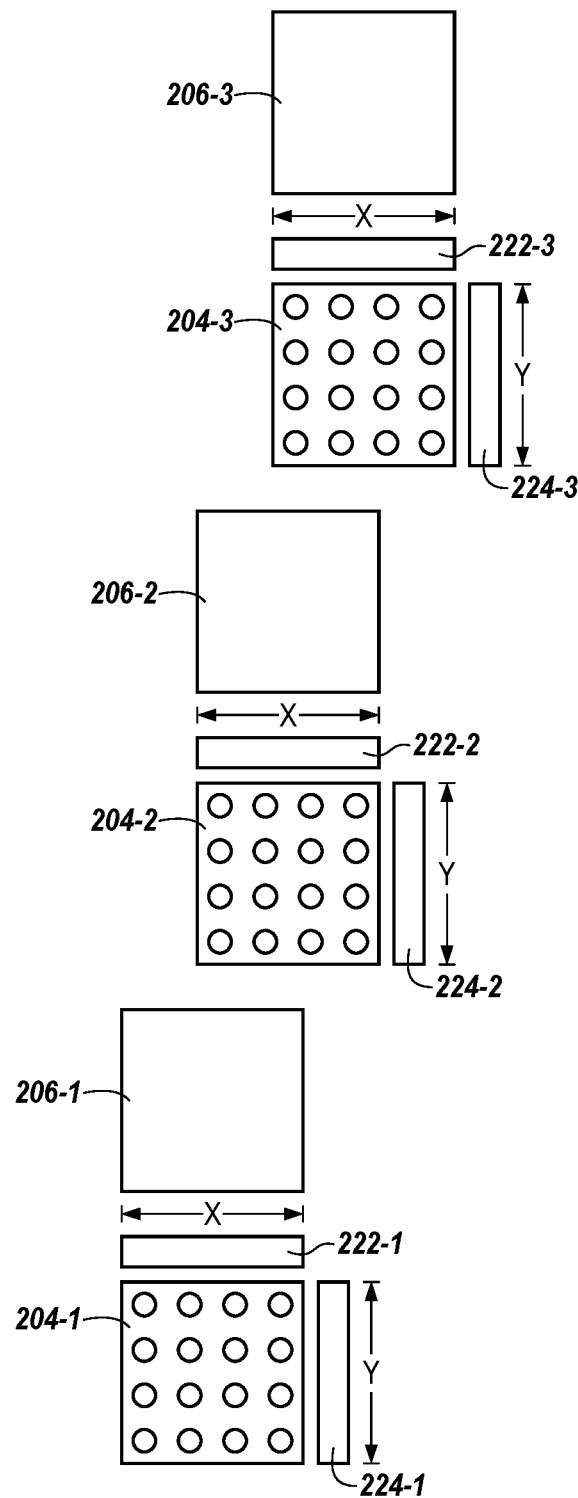
FIG. 2 is a functional block diagram of a stacked light emitting diode (LED) hologram display including arrays of LEDs, meta-optics panels, and a number of actuators in accordance with a number of embodiments of the present disclosure.

FIG. 2 is a functional block diagram of a stacked light emitting diode (LED) hologram display including arrays of LEDs, meta-optics panels, and a number of actuators in accordance with a number of embodiments of the present disclosure. FIG. 2 includes display an exploded view of LED arrays 204-1, 204-2, and 204-3 and meta-optics panels 206-1, 206-2, and 206-3 of display 200. Each LED array 204-1, 204-2, and 204-3 can include a number of LEDs 205 arranged in row and columns. In FIG. 2, each LED array 204-1, 204-2, and 204-3 includes 16 LEDs arranged in 4 rows and 4 columns. LED arrays 204-1, 204-2, and 204-3 can have any number of rows and columns of LEDS and in a number of embodiments have thousands of rows and columns of LEDs. FIG. 2 includes 4 rows and 4 columns for ease of illustration.

In a number of embodiments, display 200 can include a number pixels, where an LED at a particular row and column position of each LED array 204-1, 204-2, and 204-3 comprise a pixel. For example, in FIGS. 2, a pixel of display 200 comprises LED 205-1 in row 4, column 2 of array 204-1, LED 205-2 in row 4, column 2 of array 204-2, and LED 205-3 in row 4, column 2 of array 204-3. The pixel that includes LEDs 205-1, 205-2, and 205-3 can include light emitted from LEDs 205-1, 205-2, and 205-3. The pixel that includes LEDs 205-1, 205-2, and 205-3 can emit light that is part of an RGB holographic image, where LED 205-1 can be configured to emit red light, LED 205-2 can be configured to emit green light, and LED 205-3 can be configured to emit blue light.

Display 200 can include a number of actuators 222-1 that are configured to move array 204-1 in the first direction (e.g., x direction) and a number of actuators 224-1 that are configured to move array 204-1 in the second direction (e.g., y direction). Display 200 can include a number of actuators 222-2 that are configured to move array 204-2 in the first direction (e.g., x direction) and a number of actuators 224-2 that are configured to move array 204-2 in the second direction (e.g., y direction). Display 200 can include a number of actuators 222-3 that are configured to move array 204-3 in the first direction (e.g., x direction) and a number of actuators 224-3 that are configured to move array 204-3 in the second direction (e.g., y direction). Actuators 222-1, 224-1, 222-2, 224-2, 222-3, and 224-3 can be configured to move arrays 204-1, 204-2, and 204-3 to control the packing scheme of the LEDs of arrays 204-1, 204-2, and 204-3. The packing scheme can be the position of an LED of a pixel relative to the other LEDs of the pixel. For example, actuators 222-1 can move array 204-1 to the right such that the LEDS in array 204-1 are offset in the first direction relative to the LEDs of array 204-2 and 204-3. The packing scheme of the pixels can be controlled to control image properties of the holographic image displayed by display 200. For example, the packing scheme can be changed to control the illumination intensity, brightness, color gamut, gray level, contrast, uniformity, resolution, saturation, white balance, and/or spectral sensitivity, among other image properties, of holographic images displayed by display 200.

Meta-optics panel 206-1 can be configured to receive light from array 204-1 and be configured to display a first portion (e.g., red light) of a holographic image. Meta-optics panel can receive light from an array and transmit light through the panel to project a holographic image (e.g., by shaping and enhancing the light emitted by the array). Meta-optics panel 206-2 can be configured to receive light from array 204-2 and be configured to display a second portion (e.g., green light) of a holographic image. Meta-optics panel 206-3 can be configured to receive light from array 204-3 and be configured to display a third portion (e.g., blue light) of a holographic image. In a number of embodiments, where the actuators are configured to adjust the position of the arrays and/or LEDs in the first direction and the second direction, but not the angles of rotation (e.g., the arrays and/or LEDs have fixed angles of rotation), such as in FIG. 2, each array is associated with a meta-optics panel to produce a portion of a holographic image.

Figure 3:
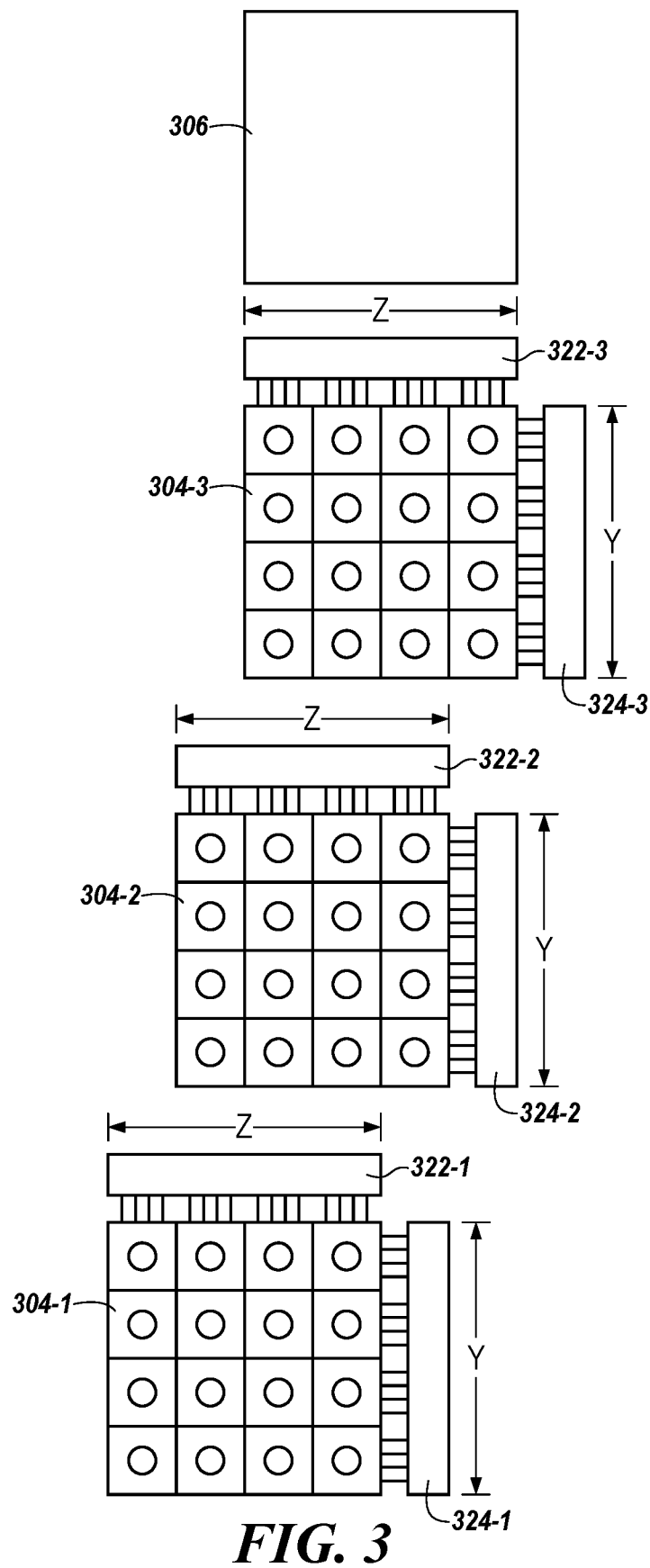
FIG. 3 is a functional block diagram of a stacked light emitting diode (LED) hologram display including arrays of LEDs, a meta-optics panel, and a number of actuators in accordance with a number of embodiments of the present disclosure.

FIG. 3 is a functional block diagram of a stacked light emitting diode (LED) hologram display including arrays of LEDs, a meta-optics panel, and a number of actuators in accordance with a number of embodiments of the present disclosure. FIG. 3 includes display an exploded view of LED arrays 304-1, 304-2, and 304-3 of display 300 and meta-optics panel 306. Each LED array 304-1, 304-2, and 304-3 can include a number of LEDs 305 arranged in row and columns. In FIG. 3, each LED array 304-1, 304-2, and 304-3 includes 16 LEDs arranged in 4 rows and 4 columns. LED arrays 304-1, 304-2, and 304-3 can have any number of rows and columns of LEDS and in a number of embodiments have thousands of rows and columns of LEDs. FIG. 3 includes 4 rows and 4 columns for ease of illustration.

In a number of embodiments, display 300 can include a number pixels, where an LED at a particular row and column position of each LED array 304-1, 304-2, and 304-3 comprise a pixel. For example, in FIGS. 3, a pixel of display 300 comprises LED 305-1 in row 4, column 2 of array 304-1, LED 305-2 in row 4, column 2 of array 304-2, and LED 305-3 in row 4, column 2 of array 304-3. The pixel that includes LEDs 305-1, 305-2, and 305-3 can include light emitted from LEDs 305-1, 305-2, and 305-3. The pixel that includes LEDs 305-1, 305-2, and 305-3 can emit light that is part of an RGB holographic image, where LED 305-1 can be configured to emit red light, LED 305-2 can be configured to emit green light, and LED 305-3 can be configured to emit blue light.

Display 300 can include a number of actuators 322-1 that are configured to individually move each LED of array 304-1 in the first direction (e.g., x direction), a number of actuators 324-1 that are configured to individually move each LED of array 304-1 in the second direction (e.g., y direction), and a number of actuators 326-1 that are configured to adjust an angle of rotation ($\alpha$) around the x-axis, an angle of rotation ($\beta$) around the y-axis, and an angle of rotation ($\gamma$) around the z-axis for each LED of array 304-1. The number of actuators 322-1 can be configured such that each LED of array 304-1 is coupled to one actuator of the number of actuators 322-1 and to individually control movement of each LED in the first direction. The number of actuators 324-1 can be configured such that each LED of array 304-1 is coupled to one actuator of the number of actuators 324-1 and to individually control movement of each LED in the second direction. The number of actuators 326-1 can be configured such that each LED of array 304-1 is coupled to one actuator of the number of actuators 326-1 and to individually control an angle of rotation ($\alpha$) around the x-axis, an angle of rotation ($\beta$) around the y-axis, and an angle of rotation ($\gamma$) around the z-axis for each LED of array 304-1.

Display 300 can include a number of actuators 322-2 that are configured to individually move each LED of array 304-2 in the first direction (e.g., x direction), a number of actuators 324-2 that are configured to individually move each LED of array 304-2 in the second direction (e.g., y direction), and a number of actuators 326-2 that are configured to adjust an angle of rotation (α) around the x-axis, an angle of rotation (β) around the y-axis, and an angle of rotation (γ) around the z-axis for each LED of array 304-2. The number of actuators 322-2 can be configured such that each LED of array 304-2 is coupled to one actuator of the number of actuators 322-2 and to individually control movement of each LED in the first direction. The number of actuators 324-2 can be configured such that each LED of array 304-2 is coupled to one actuator of the number of actuators 324-2 and to individually control movement of each LED in the second direction. The number of actuators 326-2 can be configured such that each LED of array 304-2 is coupled to one actuator of the number of actuators 326-2 and to individually control an angle of rotation (α) around the x-axis, an angle of rotation (β) around the y-axis, and an angle of rotation (γ) around the z-axis for each LED of array 304-2.

Display 300 can include a number of actuators 322-3 that are configured to individually move each LED of array 304-3 in the first direction (e.g., x direction) and a number of actuators 324-3 that are configured to individually move each LED of array 304-3 in the second direction (e.g., y direction), and a number of actuators 326-3 that are configured to adjust an angle of rotation (α) around the x-axis, an angle of rotation (β) around the y-axis, and an angle of rotation (γ) around the z-axis for each LED of array 304-3. The number of actuators 322-3 can be configured such that each LED of array 304-3 is coupled to one actuator of the number of actuators 322-3 and to individually control movement of each LED in the first direction. The number of actuators 324-3 can be configured such that each LED of array 304-3 is coupled to one actuator of the number of actuators 324-3 and to individually control movement of each LED in the second direction. The number of actuators 326-3 can be configured such that each LED of array 304-3 is coupled to one actuator of the number of actuators 326-3 and to individually control an angle of rotation (α) around the x-axis, an angle of rotation (β) around the y-axis, and an angle of rotation (γ) around the z-axis for each LED of array 304-3.

Actuators 322-1, 324-1, 326-1, 322-2, 324-2, 326-2, 322-3, 324-3, and 326-3 can be configured to individually move each of the LEDs of arrays 304-1, 304-2, and 304-3 to control the packing scheme and angle of rotation of the pixels comprising the LEDs of arrays 304-1, 304-2, and 304-3. The packing scheme can be the position of an LED of a pixel relative to the other LEDs of the pixel. For example, actuators 322-1 can move LED 305-1 to the right such that LED 305-1 in array 304-1 is offset in the first direction relative to the LED 305-2 of array 304-2 and LED 305-3 of array 304-3. The packing scheme and angles of rotation around the x, y, and z axes can allow the first array to emit light on meta-optics panel 306 configured to produce a first portion (e.g., red light) of a holographic image. The position of the LEDs in the second array of LEDs in the first and second directions and angles of rotation around the x, y, and z axes can allow the second array to emit light on meta-optics panel 306 configured to produce a second portion (e.g., green light) of the holographic image. The position of the LEDs in the third array of LEDs in the first and second directions and angles of rotation around the x, y, and z axes can allow the third array to emit light on meta-optics panel 306 configured to produce a third portion (e.g., blue light) of the holographic image The packing scheme of the pixels can be controlled to control image properties of the image displayed by display 300. For example, the packing scheme can be changed to control the brightness, color gamut, gray level, contrast, uniformity, resolution, saturation, white balance, and/or spectral sensitivity, among other image properties, of images displayed by display 300. In a number of embodiments, where actuator are configured to control movement of each LED of the LED arrays in the first direction and second direction and control angles of rotation around the x, y, and z axes for each LED of the LED arrays, one meta-optics panel (e.g. panel 306 of FIG. 3) can be configured to produce a holographic image with red light, green light, and blue light.

Figure 4A:
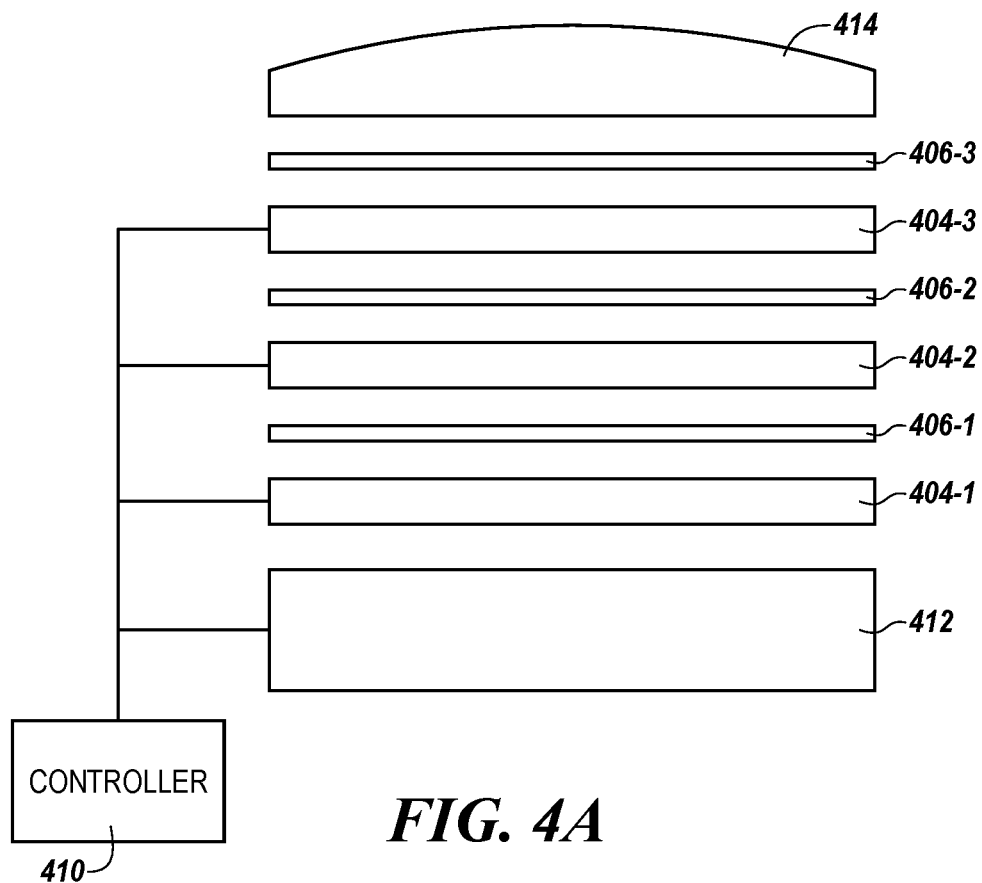
FIGS. 4A-4B are functional block diagrams in the form of an apparatus having a stacked light emitting diode (LED) hologram display including a controller in accordance with a number of embodiments of the present disclosure.
Figure 4B:
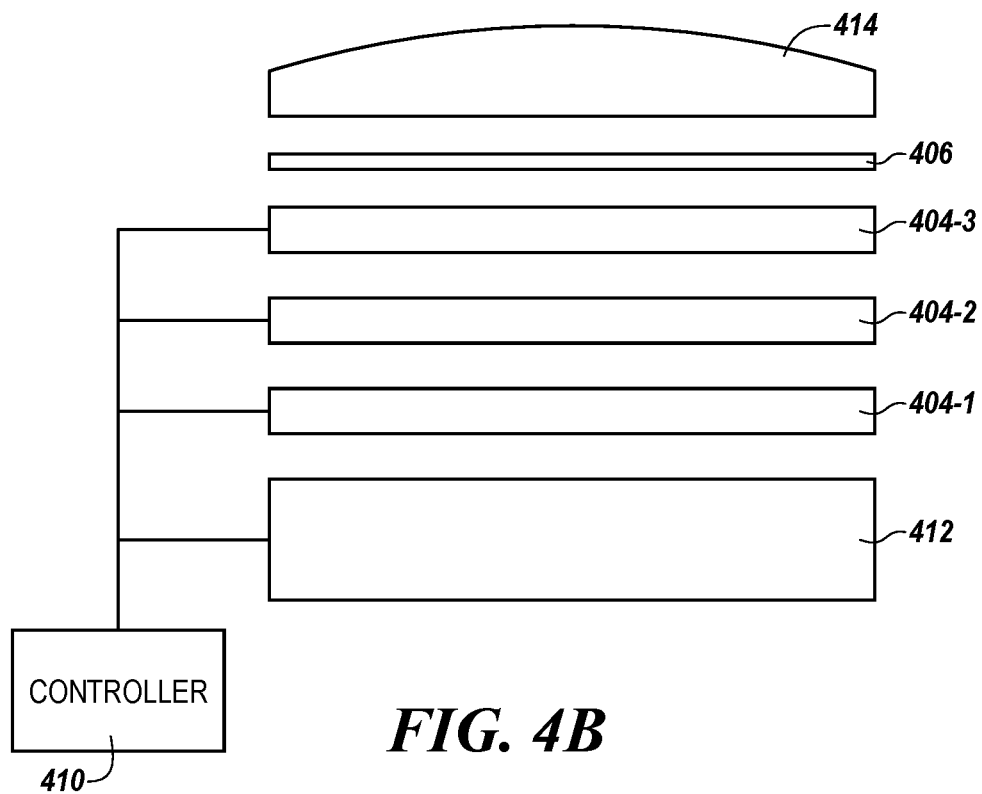

FIGS. 4A-4B are functional block diagrams in the form of an apparatus having a stacked light emitting diode (LED) hologram display including a controller in accordance with a number of embodiments of the present disclosure. In FIG. 4A, display 400 can include substrate 412, first array of LEDs 404-1, second array of LEDs 404-2, third array of LEDs 404-3, first meta-optics panel 406-1, second meta-optics panel 406-2, third meta-optics panel 406-3, cover 414, and controller 410. Display 400 can include first array of LEDs 404-1, second array of LEDs 404-2, and third array of LEDs 404-3 formed on substrate 412. First array of LEDs 404-1, second array of LEDs 404-2, and third array of LEDs 404-3 can be stacked on each other and configured such that light emitted from the first array of LEDs 404-1 is directed to first meta-optics panel 406-1 that is configured to display a first portion of a holographic image, light emitted from the second array of LEDs 404-2 is directed to second meta-optics panel 406-2 that is configured to display a second portion of a holographic image, and light emitted from the third array of LEDs 404-3 is directed to third meta-optics panel 406-3 that is configured to display a third portion of a holographic image. Cover 414 can be comprised of glass and other materials, such as polarizers. Cover 414 can protect the arrays of LEDs from damage.

In FIG. 4B, display 400 can include substrate 412, first array of LEDs 404-1, second array of LEDs 404-2, third array of LEDs 404-3, meta-optics panel 406, cover 414, and controller 410. Display 400 can include first array of LEDs 404-1, second array of LEDs 404-2, and third array of LEDs 404-3 formed on substrate 412. First array of LEDs 404-1, second array of LEDs 404-2, and third array of LEDs 404-3 can be stacked on each other and configured such that light emitted from the first array of LEDs 404-1 is directed to meta-optics panel 406 that is configured to display a first portion of a holographic image, light emitted from the second array of LEDs 404-2 is directed to meta-optics panel 406 that is configured to display a second portion of a holographic image, and light emitted from the third array of LEDs 404-3 is directed to meta-optics panel 406 that is configured to display a third portion of a holographic image. First array of LEDs 404-1, second array of LEDs 404-2, and third array of LEDs 404-3 can be moved by actuators to control movement of each LED of the LED arrays in the first direction (e.g., x direction) and second direction (e.g., y direction) and control angles of rotation around the x, y, and z axes for each LED of the LED arrays and meta-optics panel 406 can be configured to produce a holographic image with red light, green light, and blue light from the first array of LEDs 404-1, second array of LEDs 404-2, and third array of LEDs 404-3, respectively.

First array of LEDs 404-1, second array of LEDs 404-2, and third array of LEDs 404-3 can be coupled to controller 410 and can be configured to receive signals from controller 410 to activate and deactivate the LEDs. In a number of embodiments, controller 410 can send a signal or signals to individually activate and/or deactivate each LED of first array of LEDs 404-1, second array of LEDs 404-2, and third array of LEDs 404-3. For example, controller 410 can send signals to the first array of LEDs 404-1, second array of LEDs 404-2, and third array of LEDs 404-3 such that only a portion of the LEDs of the first array of LEDs 404-1, second array of LEDs 404-2, and third array of LEDs 404-3 are activated. The controller can activate only a portion of the LEDs of first array of LEDs 404-1, second array of LEDs 404-2, and third array of LEDs 404-3 to control the power consumption of display 400. Also, controller 410 can send signals with various magnitudes to control the light emitted by the LEDs of the first array of LEDs 404-1, second array of LEDs 404-2, and third array of LEDs 404-3. The signals and the magnitude of the signals sent by controller 410 to the first array of LEDs 404-1, second array of LEDs 404-2, and third array of LEDs 404-3 can control the illumination intensity, brightness, color gamut, gray level, contrast, uniformity, resolution, saturation, white balance, and/or spectral sensitivity, among other image properties, of holographic images displayed by display 400. Controller 410 can monitor the properties of the holographic image that is displayed by display 400 and change the signals sent to the first array of LEDs 404-1, second array of LEDs 404-2, and third array of LEDs 404-3 to change and/or improve the properties of the holographic image displayed by display 400. For example, controller 410 can change the brightness of the images based on the environment where the image is being displayed. Also, controller 410 can change signals sent to the first array of LEDs 404-1, second array of LEDs 404-2, and third array of LEDs 404-3 to improve image quality. Controller 410 can also receive user input to change the signals sent to the first array of LEDs 404-1, second array of LEDs 404-2, and third array of LEDs 404-3.

Figure 5A:
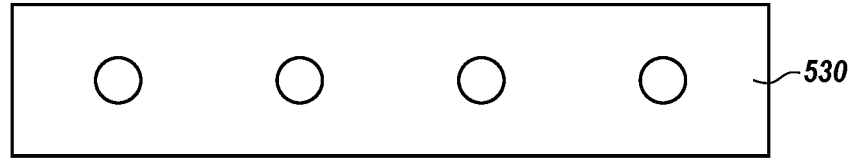
FIGS. 5A-5C illustrate packing schemes of a stacked light emitting diode (LED) hologram display in accordance with a number of embodiments of the present disclosure.
Figure 5B:
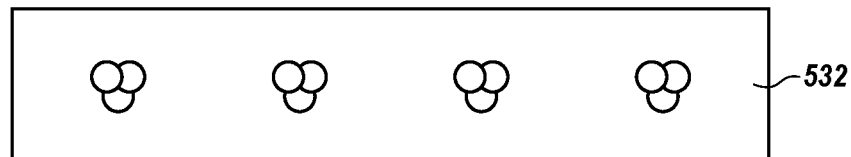
Figure 5C:
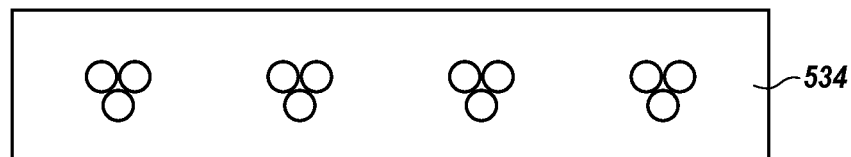

FIGS. 5A-5C illustrate packing schemes of a stacked light emitting diode (LED) display in accordance with a number of embodiments of the present disclosure. FIGS. 5A-5C illustrates packing schemes of 4 pixels, pixel 540-1, pixel 540-2, pixel 540-3, and pixel 540-4. Pixels 540-1, 540-2, 540-3, and 540-4 can include LEDs from a row of arrays of LEDs, such as a first row of arrays 204-1, 204-2, and 204-3 of FIG. 2 or a first row of arrays of 304-2, 304-2, and 304-3 of FIG. 3, for example. FIGS. 5A-5C illustrate a top down view of pixels 540-1, 540-2, 540-3, and 540-4, such the pixels comprising the LEDs from arrays of LEDs are stacked on each other.

FIG. 5A includes a packing scheme where the LEDs of pixels 540-1, 540-2, 540-3, and 540-4 are not offset and completely overlap. In FIG. 5A, pixel 540-1 includes LED 505-1-3 from a third array of LEDs and an LED from a second array (not shown due to the packing scheme not including an offset) and an LED from a first array (not shown due to the packing scheme not including an offset). Pixel 540-2 includes LED 505-2-3 from a third array of LEDs and an LED from a second array (not shown due to the packing scheme not including an offset) and an LED from a first array (not shown due to the packing scheme not including an offset). Pixel 540-3 includes LED 505-3-3 from a third array of LEDs and an LED from a second array (not shown due to the packing scheme not including an offset) and an LED from a first array (not shown due to the packing scheme not including an offset). Pixel 540-4 includes LED 505-4-3 from a third array of LEDs and an LED from a second array (not shown due to the packing scheme not including an offset) and an LED from a first array (not shown due to the packing scheme not including an offset). In a number of embodiments, a controller can send signals to actuators (e.g., actuators 222 and 224 in FIGS. 2 and 322 and 324 in FIG. 3) to move arrays and/or LEDs such that the pixels have a packing scheme that is aligned and there is no offset of the LEDs in the first or second direction (e.g., x or y direction).

FIG. 5B includes a packing scheme were the LEDs of pixels 540-1, 540-2, 540-3, and 540-4 are offset and partially overlap. In FIG. 5B, pixel 540-1 includes LED 505-1-1 from a first array of LEDs, LED 505-1-2 from a second array of LEDs that is offset in the first direction (e.g., x direction) and second direction (e.g., y direction) relative to LED 505-1-1, and LED 505-1-3 from a third array of LEDs that is offset in the first direction and second direction relative to LED 505-1-1, such that LEDs 505-1-1, 505-1-2, and 505-1-3 partially overlap each other. Pixel 540-2 includes LED 505-2-1 from a first array of LEDs, LED 505-2-2 from a second array of LEDs that is offset in the first direction and second direction relative to LED 505-2-1, and LED 505-2-3 from a third array of LEDs that is offset in the first direction and second direction relative to LED 505-2-1, such that LEDs 505-2-1, 505-2-2, and 505-2-3 partially overlap each other. Pixel 540-3 includes LED 505-3-1 from a first array of LEDs, LED 505-3-2 from a second array of LEDs that is offset in the first direction and second direction relative to LED 505-3-1, and LED 505-3-3 from a third array of LEDs that is offset in the first direction and second direction relative to LED 505-3-1, such that LEDs 505-3-1, 505-3-2, and 505-3-3 partially overlap each other. Pixel 540-4 includes LED 505-4-1 from a first array of LEDs, LED 505-4-2 from a second array of LEDs that is offset in the first direction and second direction relative to LED 505-4-1, and LED 505-4-3 from a third array of LEDs that is offset in the first direction and second direction relative to LED 505-4-1, such that LEDs 505-4-1, 505-4-2, and 505-4-3 partially overlap each other. In a number of embodiments, a controller can send signals to actuators (e.g., actuators 222 and 224 in FIGS. 2 and 322 and 324 in FIG. 3) to move arrays and/or LEDs such that the pixels have a packing scheme where there is offset of the LEDs in the x and/or y direction such that the LEDs partially overlap.

FIG. 5C includes a packing scheme were the LEDs of pixels 540-1, 540-2, 540-3, and 540-4 are offset and do not overlap. In FIG. 5B, pixel 540-1 includes LED 505-1-1 from a first array of LEDs, LED 505-1-2 from a second array of LEDs that is offset in the first direction (e.g., x direction) and second direction (e.g., y direction) relative to LED 505-1-1, and LED 505-1-3 from a third array of LEDs that is offset in the first direction and second direction relative to LED 505-1-1, such that LEDs 505-1-1, 505-1-2, and 505-1-3 do not overlap each other. Pixel 540-2 includes LED 505-2-1 from a first array of LEDs, LED 505-2-2 from a second array of LEDs that is offset in the first direction and second direction relative to LED 505-2-1, and LED 505-2-3 from a third array of LEDs that is offset in the first direction and second direction relative to LED 505-2-1, such that LEDs 505-2-1, 505-2-2, and 505-2-3 partially overlap each other. Pixel 540-3 includes LED 505-3-1 from a first array of LEDs, LED 505-3-2 from a second array of LEDs that is offset in the first direction and second direction relative to LED 505-3-1, and LED 505-3-3 from a third array of LEDs that is offset in the first direction and second direction relative to LED 505-3-1, such that LEDs 505-3-1, 505-3-2, and 505-3-3 do not overlap each other. Pixel 540-4 includes LED 505-4-1 from a first array of LEDs, LED 505-4-2 from a second array of LEDs that is offset in the first direction and second direction relative to LED 505-4-1, and LED 505-4-3 from a third array of LEDs that is offset in the first direction and second direction relative to LED 505-4-1, such that LEDs 505-4-1, 505-4-2, and 505-4-3 do not overlap each other. In a number of embodiments, a controller can send signals to actuators (e.g., actuators 222 and 224 in FIGS. 2 and 322 and 324 in FIG. 3) to move arrays and/or LEDs such that the pixels have a packing scheme where there is offset of the LEDs in the first and/or second direction such that the LEDs do not overlap.

FIG. 6 is flow diagram representing an example method for operating a stacked light emitting diode (LED) hologram display in accordance with a number of embodiments of the present disclosure. At step 650, the method can include adjusting a position of a first array of light emitting diodes (LEDs) in a first direction and a second direction orthogonal to the first direction, the adjusting relative to an origin point of the first array, wherein the first array of LEDs are configured to emit red light in a red green blue (RGB) hologram display.

At step 652, the method can include displaying a first portion of a holographic image by a first meta-optics panel from light emitted by the first array.

At step 654, the method can include adjusting a position of a second array of LEDs in the first direction and the second direction relative to an origin point of the second array, wherein the second array of LEDs are configured to emit green light in the RGB display.

At step 656, the method can include displaying a second portion of the holographic image by a second meta-optics panel from light emitted by the second array.

At step 658, the method can include adjusting a position of a second array of LEDs in the first direction and the second direction relative to an origin point of the third array, wherein the third array of LEDs are configured to emit blue light in the RGB display.

At step 660, the method can include displaying a third portion of the holographic image by a third meta-optics panel from light emitted by the third array, wherein the first, second, and third arrays are stacked on each other.

The method can also include adjusting the position of the first array of LEDs in the first direction and the second direction offsets the first array of LEDs relative to the second and third array of LEDs, adjusting the position of the second array of LEDs in the first direction and the second direction offsets the second array of LEDs relative to the first and third array of LEDs, and adjusting the position of the third array of LEDs in the first direction and the second direction offsets the third array of LEDs relative to the first and second array of LEDs.

The method can include providing signals to the first array of LEDs, the second array of LEDs, and the third array of LEDs to change an illumination intensity of the LEDs and providing signals to the first array of LEDs, the second array of LEDs, and the third array of LEDs to deactivate at least a portion of one of the first array of LEDs, the second array of LEDs, and the third array of LEDs.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    adjusting a position of a first array of light emitting diodes (LEDs) relative to an origin point of the first array, wherein the first array of LEDs are configured to emit red light in a red green blue (RGB) hologram display;
    displaying a first portion of a holographic image by a first meta-optics panel from light emitted by the first array;
    adjusting a position of a second array of LEDs relative to an origin point of the second array, wherein the second array of LEDs are configured to emit green light in the RGB display;
    displaying a second portion of the holographic image by a second meta-optics panel from light emitted by the second array;
    adjusting a position of a second array of LEDs relative to an origin point of the third array, wherein the third array of LEDs are configured to emit blue light in the RGB display and; and
    displaying a third portion of the holographic image by a third meta-optics panel from light emitted by the third array, wherein the first, second, and third arrays are stacked on each other.

2. The method of claim 1, further comprising adjusting the position of the first array of LEDs in a first direction and a second direction offsets the first array of LEDs relative to the second and third array of LEDs.

3. The method of claim 1, further comprising adjusting the position of the second array of LEDs in a first direction and a second direction offsets the second array of LEDs relative to the first and third array of LEDs.

4. The method of claim 1, further comprising adjusting the position of the third array of LEDs in a first direction and a second direction offsets the third array of LEDs relative to the first and second array of LEDs.

5. The method of claim 1, wherein the first array of LEDs, the second array of LEDs, and the third array of LEDs are parallel to each other at a fixed angle.

6. The method of claim 1, further comprising providing signals to the first array of LEDs, the second array of LEDs, and the third array of LEDs to change an illumination intensity of the LEDs.

7. The method of claim 1, further comprising providing signals to the first array of LEDs, the second array of LEDs, and the third array of LEDs to deactivate at least a portion of one of the first array of LEDs, the second array of LEDs, and the third array of LEDs.

8. An apparatus, comprising:
    a first array of light emitting diodes (LED), wherein each LED of the first array are configured to emit red light received by a first meta-optics panel configured to display a first portion of a holographic image and wherein the first array is coupled to a controller:

a second array of LEDs, wherein each LED of the second array are configured to emit green light received by a second meta-optics panel configured to display a second portion of the holographic image and wherein the second array is coupled to the controller; and a third array of LEDs, wherein each LED of the third array are configured to emit blue light received by a third meta-optics panel configured to display a third portion of the holographic image, wherein the third array is coupled to the controller, and wherein the controller is configured to:

send a first number of signals to a first actuator configured to move the first array, send a second number of signals to a second actuator to move the second array, and send a third number of signals to move the third array, wherein moving the first array, the second array, and the third array controls a packing scheme of the first, second, and third arrays.

9. The apparatus of claim 8, wherein the first actuator is configured to move the first array to offset the LEDs of the first array relative to the LEDs of the second and third arrays.

10. The apparatus of claim 8, wherein the second actuator is configured to move the second array to offset the LEDs of the second array relative to the LEDs of the first and third arrays.

11. The apparatus of claim 8, wherein the third actuator is configured to move the third array to offset the LEDs of the third array relative to the LEDs of the first and second arrays.

12. The apparatus of claim 8, wherein the first, second, and third actuators are configured to move the first, second and third arrays in a first direction and a second direction to change the packing scheme of the first, second, and third arrays that are stacked on each other.

13. The apparatus of claim 8, wherein the control circuitry is configured to provide signals to the first, second, and third arrays to change illumination intensity of the apparatus by activating at least a portion of the first, second, and third arrays.

14. The apparatus of claim 8, wherein the control circuitry is configured to provide signals to the first, second, and third arrays to control power consumption of the apparatus by activating at least a portion of the first, second, and third arrays.

15. An apparatus, comprising:

a first array of light emitting diodes (LED), wherein each LED of the first array are configured to emit red light received by a meta-optics panel configured to display a first portion of a holographic image and wherein the first array is coupled to a controller:

a second array of LEDs, wherein each LED of the second array are configured to emit green light received by the meta-optics panel configured to display a second portion of the holographic image and wherein the second array is coupled to the controller; and a third array of LEDs, wherein each LED of the third array are configured to emit blue light received by the meta-optics panel configured to display a third portion of the holographic image, wherein the third array is coupled to the controller, wherein the first, second, and third array are stacked on each other, and wherein the controller is configured to:

send a first number of signals to a first number of actuators configured to move each of the LEDs in the first array and rotate each of the LEDs in the first array, send a second number of signals to a second number of actuators to move each of the LEDs in the second array and rotate each of the LEDs in the second array, and send a third number of signals to a third number of actuators configured to move each of the LEDs in the third array and rotate each of the LEDs in the third array.

16. The apparatus of claim 15, wherein the control circuitry is configured to send a fourth number of signals to control intensity of each of the LEDs of the first, second, and third arrays.

17. The apparatus of claim 15, wherein the control circuitry is configured to send a fifth number of signals to turn on a portion of the LEDs of the first, second, and third arrays.

18. The apparatus of claim 15, wherein a position with respect to a first direction and a second direction of each LED of the first array overlaps with a position with respect to the first direction and second direction of each LED of the second array.

19. The apparatus of claim 15, wherein first, second, and third number of signals can be controlled by user input.

20. The apparatus of claim 15, wherein the first number of signals, the second number of signals, and the third number of signals are configured to control a packing scheme of the first, second and third arrays.

* * * * *